United States Patent
Wright

(10) Patent No.: US 7,721,609 B2
(45) Date of Patent: May 25, 2010

(54) METHOD AND APPARATUS FOR SENSING THE FORCE WITH WHICH A BUTTON IS PRESSED

(75) Inventor: David Wright, Escondido, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 34 days.

(21) Appl. No.: 11/394,982

(22) Filed: Mar. 31, 2006

(65) Prior Publication Data

US 2007/0227256 A1    Oct. 4, 2007

(51) Int. Cl.
*G01D 7/00* (2006.01)
*G01R 27/26* (2006.01)
*G06F 3/045* (2006.01)

(52) U.S. Cl. .................. 73/862.043; 345/174; 324/681; 324/662; 324/686

(58) Field of Classification Search .................... 73/780, 73/862.04, 862.043; 354/17; 178/18; 324/661–662, 324/681, 686; 345/174
See application file for complete search history.

(56) References Cited

U.S. PATENT DOCUMENTS

| | | | |
|---|---|---|---|
| 3,922,093 A | 11/1975 | Dandliker et al. | |
| 4,054,881 A | 10/1977 | Raab | |
| 4,113,378 A | 9/1978 | Wirtz | |
| 4,218,623 A | 8/1980 | Utagawa | |
| 4,283,713 A | 8/1981 | Philipp | |
| 4,438,404 A | 3/1984 | Philipp | |
| 4,441,123 A | 4/1984 | Ochi | |
| 4,475,151 A | 10/1984 | Philipp | |
| 4,497,575 A | 2/1985 | Philipp | |
| 4,546,347 A | 10/1985 | Kirsch | |
| 4,605,308 A | 8/1986 | Hankel et al. | |
| 4,736,097 A | 4/1988 | Philipp | |
| 4,751,380 A | 6/1988 | Victor et al. | |
| 4,754,268 A | 6/1988 | Mori | |
| 4,773,024 A | 9/1988 | Faggin et al. | |
| 4,799,055 A | 1/1989 | Nestler et al. | |
| 4,802,103 A | 1/1989 | Faggin et al. | |
| 4,812,635 A | 3/1989 | Kaufmann et al. | |
| 4,814,553 A | 3/1989 | Joyce | |
| 4,831,325 A | 5/1989 | Watson, Jr. | |
| 4,876,534 A | 10/1989 | Mead et al. | |
| 4,879,461 A | 11/1989 | Philipp | |
| 4,920,260 A | 4/1990 | Victor et al. | |
| 4,935,702 A | 6/1990 | Mead et al. | |
| 4,945,305 A | 7/1990 | Blood | |
| 4,953,928 A | 9/1990 | Anderson et al. | |

(Continued)

FOREIGN PATENT DOCUMENTS

WO    WO 03/003290 A1    8/2003

OTHER PUBLICATIONS

U.S. Appl. No. 10/875,561, David Wright.

(Continued)

*Primary Examiner*—Lisa M Caputo
*Assistant Examiner*—Jonathan Dunlap

(57) ABSTRACT

Disclosed is an apparatus for sensing a force, comprising an actuator having a conductive deformable surface, a substrate having a first conductive trace and a second conductive trace, a housing coupled to the actuator and to the substrate, holding the actuator in proximity to the substrate, and a circuit for measuring a capacitance value.

16 Claims, 8 Drawing Sheets

U.S. PATENT DOCUMENTS

| | | | |
|---|---|---|---|
| 4,962,342 A | 10/1990 | Mead et al. | |
| 4,988,981 A | 1/1991 | Zimmerman et al. | |
| 5,049,758 A | 9/1991 | Mead et al. | |
| 5,055,827 A | 10/1991 | Philipp | |
| 5,059,920 A | 10/1991 | Anderson et al. | |
| 5,059,959 A | 10/1991 | Barry | |
| 5,068,622 A | 11/1991 | Mead et al. | |
| 5,073,759 A | 12/1991 | Mead et al. | |
| 5,083,044 A | 1/1992 | Mead et al. | |
| 5,095,284 A | 3/1992 | Mead | |
| 5,097,305 A | 3/1992 | Mead et al. | |
| 5,101,669 A * | 4/1992 | Holm-Kennedy et al. | 73/862.626 |
| 5,107,149 A | 4/1992 | Platt et al. | |
| 5,109,261 A | 4/1992 | Mead et al. | |
| 5,119,038 A | 6/1992 | Anderson et al. | |
| 5,120,996 A | 6/1992 | Mead et al. | |
| 5,122,800 A | 6/1992 | Philipp | |
| 5,126,685 A | 6/1992 | Platt et al. | |
| 5,146,106 A | 9/1992 | Anderson et al. | |
| 5,160,899 A | 11/1992 | Anderson et al. | |
| 5,165,054 A | 11/1992 | Platt et al. | |
| 5,166,562 A | 11/1992 | Allen et al. | |
| 5,204,549 A | 4/1993 | Platt et al. | |
| 5,243,554 A | 9/1993 | Allen et al. | |
| 5,248,873 A | 9/1993 | Allen et al. | |
| 5,260,592 A | 11/1993 | Mead et al. | |
| 5,264,856 A | 11/1993 | Thurlow | |
| 5,270,963 A | 12/1993 | Allen et al. | |
| 5,276,407 A | 1/1994 | Mead et al. | |
| 5,288,993 A | 2/1994 | Bidiville et al. | |
| 5,289,023 A | 2/1994 | Mead | |
| 5,303,329 A | 4/1994 | Mead et al. | |
| 5,305,017 A | 4/1994 | Gerpheide | |
| 5,324,958 A | 6/1994 | Mead et al. | |
| 5,331,215 A | 7/1994 | Allen et al. | |
| 5,336,936 A | 8/1994 | Allen et al. | |
| 5,339,213 A | 8/1994 | O'Callaghan | |
| 5,345,527 A | 9/1994 | Lebby et al. | |
| 5,349,303 A | 9/1994 | Gerpheide | |
| 5,374,787 A | 12/1994 | Miller et al. | |
| 5,381,515 A | 1/1995 | Platt et al. | |
| 5,384,467 A | 1/1995 | Plimon et al. | |
| 5,391,868 A | 2/1995 | Vampola et al. | |
| 5,408,194 A | 4/1995 | Steinbach et al. | |
| 5,473,344 A | 12/1995 | Bacon et al. | |
| 5,488,204 A | 1/1996 | Mead et al. | |
| 5,495,077 A | 2/1996 | Miller et al. | |
| 5,534,693 A | 7/1996 | Kondo et al. | |
| 5,541,878 A | 7/1996 | LeMoncheck et al. | |
| 5,543,588 A | 8/1996 | Bisset et al. | |
| 5,543,590 A | 8/1996 | Gillespie et al. | |
| 5,543,591 A | 8/1996 | Gillespie et al. | |
| 5,555,907 A | 9/1996 | Philipp | |
| 5,565,658 A | 10/1996 | Gerpheide et al. | |
| 5,565,887 A | 10/1996 | McCambridge et al. | |
| 5,566,702 A | 10/1996 | Philipp | |
| 5,578,813 A | 11/1996 | Allen et al. | |
| 5,606,174 A | 2/1997 | Yoshimura et al. | |
| 5,629,891 A | 5/1997 | LeMoncheck et al. | |
| 5,644,139 A | 7/1997 | Allen et al. | |
| 5,648,642 A | 7/1997 | Miller et al. | |
| D382,550 S | 8/1997 | Kaneko et al. | |
| 5,661,240 A | 8/1997 | Kemp | |
| 5,670,915 A | 9/1997 | Cooper et al. | |
| D385,542 S | 10/1997 | Kaneko et al. | |
| 5,682,032 A | 10/1997 | Philipp | |
| 5,703,356 A | 12/1997 | Bidiville et al. | |
| 5,729,008 A | 3/1998 | Blalock et al. | |
| 5,729,009 A | 3/1998 | Dandliker et al. | |
| 5,730,165 A | 3/1998 | Philipp | |
| 5,757,368 A | 5/1998 | Gerpheide et al. | |
| 5,760,392 A | 6/1998 | Hisamoto et al. | |
| 5,763,909 A | 6/1998 | Mead et al. | |
| 5,766,829 A | 6/1998 | Cathey, Jr. et al. | |
| 5,767,457 A | 6/1998 | Gerpheide et al. | |
| 5,781,229 A | 7/1998 | Zediker et al. | |
| 5,786,804 A | 7/1998 | Gordon | |
| 5,796,183 A | 8/1998 | Hourmand | |
| 5,812,698 A | 9/1998 | Platt et al. | |
| 5,825,044 A | 10/1998 | Allen et al. | |
| 5,841,078 A | 11/1998 | Miller et al. | |
| 5,844,265 A | 12/1998 | Mead et al. | |
| 5,854,482 A | 12/1998 | Bidiville et al. | |
| 5,854,625 A | 12/1998 | Frisch et al. | |
| 5,861,583 A | 1/1999 | Schediwy et al. | |
| 5,861,875 A | 1/1999 | Gerpheide | |
| 5,864,242 A | 1/1999 | Allen et al. | |
| 5,864,392 A | 1/1999 | Winklhofer et al. | |
| 5,880,411 A | 3/1999 | Gillespie et al. | |
| 5,889,236 A | 3/1999 | Gillespie et al. | |
| 5,907,152 A | 5/1999 | Dandliker et al. | |
| 5,914,465 A | 6/1999 | Allen et al. | |
| 5,914,708 A | 6/1999 | LaGrange et al. | |
| 5,917,544 A | 6/1999 | Sobotta et al. | |
| 5,920,310 A | 7/1999 | Faggin et al. | |
| 5,923,757 A | 7/1999 | Hocker et al. | |
| 5,926,566 A | 7/1999 | Wang et al. | |
| 5,942,733 A | 8/1999 | Allen et al. | |
| 5,943,052 A | 8/1999 | Allen et al. | |
| 5,963,197 A | 10/1999 | Bacon et al. | |
| 5,969,513 A | 10/1999 | Clark | |
| 5,994,710 A | 11/1999 | Knee et al. | |
| 6,014,602 A | 1/2000 | Kithil et al. | |
| 6,023,422 A | 2/2000 | Allen et al. | |
| 6,028,271 A | 2/2000 | Gillespie et al. | |
| 6,028,959 A | 2/2000 | Wang et al. | |
| 6,031,218 A | 2/2000 | Piot et al. | |
| 6,037,643 A | 3/2000 | Knee | |
| 6,057,540 A | 5/2000 | Gordon et al. | |
| 6,097,371 A | 8/2000 | Siddiqui et al. | |
| 6,097,432 A | 8/2000 | Mead et al. | |
| 6,148,104 A | 11/2000 | Wang et al. | |
| 6,151,015 A | 11/2000 | Badyal et al. | |
| 6,172,354 B1 | 1/2001 | Adan et al. | |
| 6,184,871 B1 | 2/2001 | Teres et al. | |
| 6,185,450 B1 | 2/2001 | Seguine et al. | |
| 6,188,228 B1 | 2/2001 | Philipp | |
| 6,188,391 B1 | 2/2001 | Seely et al. | |
| 6,222,528 B1 | 4/2001 | Gerpheide et al. | |
| 6,225,617 B1 | 5/2001 | Dandliker et al. | |
| 6,233,368 B1 | 5/2001 | Badyal et al. | |
| 6,239,389 B1 | 5/2001 | Allen et al. | |
| 6,249,447 B1 | 6/2001 | Boylan et al. | |
| 6,262,717 B1 | 7/2001 | Donohue et al. | |
| 6,270,114 B2 | 8/2001 | Mai et al. | |
| 6,280,391 B1 | 8/2001 | Olson et al. | |
| 6,281,881 B1 | 8/2001 | Siddiqui et al. | |
| 6,281,882 B1 | 8/2001 | Gordon et al. | |
| 6,288,707 B1 | 9/2001 | Philipp | |
| 6,304,014 B1 | 10/2001 | England et al. | |
| 6,320,184 B1 | 11/2001 | Winklhofer et al. | |
| 6,323,846 B1 | 11/2001 | Westerman et al. | |
| 6,326,859 B1 | 12/2001 | Goldman et al. | |
| 6,326,950 B1 | 12/2001 | Liu | |
| 6,330,057 B1 | 12/2001 | Lederer et al. | |
| 6,351,257 B1 | 2/2002 | Liu | |
| 6,356,187 B2 | 3/2002 | Jinno et al. | |
| 6,373,265 B1 * | 4/2002 | Morimoto et al. | 324/686 |
| 6,377,009 B1 | 4/2002 | Philipp | |
| 6,378,381 B1 * | 4/2002 | Okada et al. | 73/862.043 |
| 6,380,929 B1 | 4/2002 | Platt | |
| 6,380,931 B1 | 4/2002 | Gillespie et al. | |
| 6,384,512 B1 | 5/2002 | Maeda | |

| | | |
|---|---|---|
| 6,396,479 B2 | 5/2002 | Gordon |
| 6,414,671 B1 | 7/2002 | Gillespie et al. |
| 6,421,045 B1 | 7/2002 | Venkat et al. |
| 6,424,407 B1 | 7/2002 | Kinrot et al. |
| 6,430,305 B1 | 8/2002 | Decker |
| 6,433,780 B1 | 8/2002 | Gordon et al. |
| 6,441,073 B1 | 8/2002 | Tanaka et al. |
| 6,452,514 B1 | 9/2002 | Philipp |
| 6,452,683 B1 | 9/2002 | Kinrot et al. |
| 6,455,840 B1 | 9/2002 | Oliver et al. |
| D464,352 S | 10/2002 | Kerestegian |
| 6,457,355 B1 | 10/2002 | Philipp |
| 6,462,330 B1 | 10/2002 | Venkat et al. |
| 6,466,036 B1 | 10/2002 | Philipp |
| 6,473,069 B1 | 10/2002 | Gerpheide |
| 6,476,376 B1 | 11/2002 | Biegelsen et al. |
| 6,476,970 B1 | 11/2002 | Smith |
| 6,489,899 B1 | 12/2002 | Ely et al. |
| 6,498,720 B2 | 12/2002 | Glad |
| 6,499,359 B1 | 12/2002 | Washeleski et al. |
| 6,504,115 B2 * | 1/2003 | Nakai ............................ 200/6 A |
| 6,522,128 B1 | 2/2003 | Ely et al. |
| 6,523,416 B2 | 2/2003 | Takagi et al. |
| 6,529,184 B1 | 3/2003 | Julienne |
| 6,534,970 B1 | 3/2003 | Ely et al. |
| 6,535,200 B2 | 3/2003 | Philipp |
| 6,552,550 B2 | 4/2003 | Karray et al. |
| 6,570,557 B1 | 5/2003 | Westerman et al. |
| 6,583,632 B2 | 6/2003 | Von Basse et al. |
| 6,585,158 B2 | 7/2003 | Norskog |
| 6,587,093 B1 | 7/2003 | Shaw et al. |
| 6,603,111 B2 | 8/2003 | Dietz et al. |
| 6,610,936 B2 | 8/2003 | Gillespie et al. |
| 6,621,483 B2 | 9/2003 | Wallace et al. |
| 6,624,640 B2 | 9/2003 | Lund et al. |
| 6,639,586 B2 | 10/2003 | Gerpheide |
| 6,642,506 B1 | 11/2003 | Nahum et al. |
| 6,642,857 B1 | 11/2003 | Schediwy et al. |
| 6,649,924 B1 | 11/2003 | Philipp et al. |
| 6,664,948 B2 | 12/2003 | Crane et al. |
| 6,667,740 B2 | 12/2003 | Ely et al. |
| 6,673,308 B2 | 1/2004 | Hino et al. |
| 6,674,475 B1 | 1/2004 | Anderson |
| 6,677,929 B2 | 1/2004 | Gordon et al. |
| 6,677,932 B1 | 1/2004 | Westerman |
| 6,680,731 B2 | 1/2004 | Gerpheide et al. |
| 6,683,462 B2 | 1/2004 | Shimizu |
| 6,703,599 B1 | 3/2004 | Casebolt et al. |
| 6,705,511 B1 | 3/2004 | Dames et al. |
| 6,714,817 B2 | 3/2004 | Daynes et al. |
| 6,730,863 B2 | 5/2004 | Gerpheide |
| 6,737,636 B2 | 5/2004 | Dietz et al. |
| 6,741,335 B2 | 5/2004 | Kinrot et al. |
| 6,750,852 B2 | 6/2004 | Gillespie |
| 6,774,351 B2 | 8/2004 | Black |
| 6,774,644 B2 | 8/2004 | Eberlein |
| 6,774,915 B2 | 8/2004 | Rensberger |
| 6,781,577 B2 | 8/2004 | Shigetaka |
| 6,788,221 B1 | 9/2004 | Ely et al. |
| 6,788,521 B2 | 9/2004 | Nishi |
| 6,795,056 B2 | 9/2004 | Norskog et al. |
| 6,798,218 B2 | 9/2004 | Kasperkovitz |
| 6,809,275 B1 | 10/2004 | Cheng et al. |
| 6,809,403 B2 | 10/2004 | Gee |
| 6,809,723 B2 | 10/2004 | Davis |
| 6,819,314 B2 | 11/2004 | Black |
| 6,823,077 B2 | 11/2004 | Dietz et al. |
| 6,825,765 B2 | 11/2004 | Stanley et al. |
| 6,850,227 B2 | 2/2005 | Takahashi et al. |
| 6,856,433 B2 | 2/2005 | Hatano et al. |
| 6,873,203 B1 | 3/2005 | Latham, II et al. |
| 6,888,538 B2 | 5/2005 | Ely et al. |
| 6,893,724 B2 | 5/2005 | Lin et al. |
| 6,903,402 B2 | 6/2005 | Miyazawa |
| 6,904,570 B2 | 6/2005 | Foote et al. |
| 6,906,700 B1 * | 6/2005 | Armstrong .................. 345/161 |
| 6,922,063 B2 | 7/2005 | Heger |
| 6,940,495 B2 * | 9/2005 | Morimoto et al. ............ 345/174 |
| 6,946,853 B2 | 9/2005 | Gifford et al. |
| 6,949,811 B2 | 9/2005 | Miyazawa |
| 6,950,094 B2 | 9/2005 | Gordon et al. |
| 6,967,321 B2 | 11/2005 | Leong et al. |
| 6,969,978 B2 | 11/2005 | Dening |
| 6,975,123 B1 | 12/2005 | Malang et al. |
| 6,977,645 B2 | 12/2005 | Brosnan |
| 6,990,867 B2 * | 1/2006 | Okada .......................... 73/780 |
| 7,006,078 B2 | 2/2006 | Kim |
| 7,019,733 B2 | 3/2006 | Koay |
| 7,030,782 B2 | 4/2006 | Ely et al. |
| 7,042,575 B2 | 5/2006 | Carlisle et al. |
| 7,050,798 B2 | 5/2006 | Ranta |
| 7,075,527 B2 * | 7/2006 | Takagi et al. ................. 345/184 |
| 7,109,978 B2 | 9/2006 | Gillespie et al. |
| 7,119,550 B2 | 10/2006 | Kitano et al. |
| 7,119,552 B2 * | 10/2006 | Morimoto et al. ............ 324/661 |
| 7,122,781 B2 | 10/2006 | Rotzoll et al. |
| 7,126,585 B2 | 10/2006 | Davis et al. |
| 7,133,140 B2 | 11/2006 | Lukacs et al. |
| 7,133,793 B2 | 11/2006 | Ely et al. |
| 7,138,620 B2 | 11/2006 | Trisnadi et al. |
| 7,141,968 B2 | 11/2006 | Hibbs et al. |
| 7,141,987 B2 | 11/2006 | Hibbs et al. |
| 7,151,528 B2 | 12/2006 | Taylor et al. |
| 7,161,682 B2 | 1/2007 | Xie et al. |
| 7,212,189 B2 | 5/2007 | Shaw et al |
| 7,248,345 B2 | 7/2007 | Todoroff et al. |
| 7,268,341 B2 | 9/2007 | Lehoty et al. |
| 7,288,977 B2 | 10/2007 | Stanley |
| 7,298,124 B2 | 11/2007 | Kan et al. |
| 7,321,359 B2 | 1/2008 | Xie et al. |
| 7,325,723 B2 | 2/2008 | Desjeux |
| 7,466,307 B2 | 12/2008 | Trent, Jr. et al. |
| 7,499,020 B2 | 3/2009 | Kurashima et al. |
| 2002/0063688 A1 | 5/2002 | Shaw et al. |
| 2002/0191029 A1 | 12/2002 | Gillespie et al. |
| 2003/0058506 A1 | 3/2003 | Green et al. |
| 2003/0060218 A1 | 3/2003 | Billerbeck et al. |
| 2003/0062889 A1 | 4/2003 | Ely et al. |
| 2003/0080755 A1 | 5/2003 | Kobayashi |
| 2003/0091220 A1 | 5/2003 | Sato et al. |
| 2003/0222660 A1 * | 12/2003 | Morimoto .................... 324/661 |
| 2004/0160235 A1 * | 8/2004 | Okada et al. ................. 324/681 |
| 2004/0169638 A1 | 9/2004 | Kaplan |
| 2005/0024341 A1 | 2/2005 | Gillespie et al. |
| 2005/0031175 A1 | 2/2005 | Hara et al. |
| 2005/0057266 A1 * | 3/2005 | Morimoto .................... 324/661 |
| 2005/0083303 A1 | 4/2005 | Schroeder et al. |
| 2006/0032680 A1 | 2/2006 | Elias et al. |
| 2006/0097991 A1 | 5/2006 | Hotelling et al. |
| 2006/0273804 A1 | 12/2006 | Delorme et al. |
| 2007/0126700 A1 | 6/2007 | Wright |

OTHER PUBLICATIONS

U.S. Appl. No. 11/294,913, David Wright.
U.S. Appl. No. 60/771,128, Khler Remadna.
U.S. Appl. No. 11/280,830, Michael Dueweke.
U.S. Appl. No. 11/408,367, Mark Francis.
U.S. Appl. No. 11/273,708, Warren Snyder.
Interlink, FSR, Force Sensing Resistors, Datasheet, 2 Pages (see attached).
USPTO Non-Final Rejection for U.S. Appl. No. 10/875,561 (CD03049) dated Sep. 2, 2009; 7 pages.
USPTO Final Rejection or U.S. Appl. No. 10/875,561 (CD03049) dated May 12, 2009; 7 pages.

USPTO Non-Final Rejection for U.S. Appl. No. 10/875,561 (CD03049) dated Oct. 29, 2008; 8 pages.
USPTO Non-Final Rejection for U.S. Appl. No. 10/875,561 (CD03049) dated Apr. 1, 2008; 8 pages.
USPTO Final Rejection for U.S. Appl. No. 10/875,561 (CD03049) dated Nov. 15, 2007, 16 pages.
USPTO Non-Final Rejection for U.S. Appl. No. 10/875,561 (CD03049) dated Jun. 20, 2007; 16 pages.
USPTO Non-Final Rejection for U.S. Appl. No. 11/408,367 (CD05043) dated Oct. 14, 2009, 12 pages.
USPTO Final Rejection for U.S. Appl. No. 11/408,367 (CD05043) dated Dec. 5, 2008; 14 pages.
USPTO Non-Final Rejection for U.S. Appl. No. 11/408,367 (CD05043) dated May 19, 2008: 16 pages.
USPTO Non-Final Rejection for U.S. Appl. No. 11/408,367 (CD05043) dated Oct. 29, 2007; 12 pages.
USPTO Advisory Action for U.S. Appl. No. 11/408,367 (CD05043) dated Jul. 3, 2007; 3 pages.
USPTO Final Rejection for U.S. Appl. No. 11/408,367 (CD05043) dated Apr. 6, 2007; 10 pages.
USPTO Non-Final Rejection for U.S. Appl. No. 11/408,367 (CD05043) dated Sep. 6, 2006; 10 pages.
USPTO Miscellaneous Action for U.S. Appl. No. 11/408,367 (CD05043) dated Jun. 2, 2006; 1 page.
USPTO Notice of Allowence for U.S. Appl. No. 11/273,708 (CD05141) dated Aug. 9, 2007, 4 pages.
USPTO Final Rejection for U.S. Appl. No. 11/273,708 (CD05141) dated Jul. 5, 2007; 8 pages.
USPTO Non-Final Rejection for U.S. Appl. No. 11/273,708 (CD05141) dated Mar. 19, 2007; 16 pages.
USPTO Notice of Allowance for U.S. Appl. No. 11/280,830 (SLMP0359) dated Apr. 10, 2008; 6 pages.
USPTO Non-Final Rejection for U.S. Appl. No. 11/280,830 (SLMP0359) dated Dec. 13, 2007; 11 pages.
USPTO Requirement for Restriction/Election for U.S. Appl. No. 11/280,830 (SLMP0359) dated Oct. 11, 2007; 6 pages.
"Logitech Marble Optical Technology White Paper", Logitech Inc., Marble White Paper, Jan. 23, 2002; 6 pages.
"Optical Marble Technology," Logitech Inc., downloaded Nov. 29, 2005, <http:/www.logitech.com/index.cfm/products/technology/documents/US/EN,CRID=907,parentCRID=815>; 2 pages.
"CYBORG EVO," Saitek, downloaded Oct. 10, 2005, <http://www.saitekusa.com/usa/prod/cyborg_evo.htm>; 2 pages.
"Logitech Extreme 3D Pro," Logitech Inc., downloaded Oct. 10, 2005, <http://www.logite.com/index.cfm/products/details/NO/EN,CRID=2221,CONTENTID. . .>, 2 pages.
"Microsoft Sidewinder Precision Pro Joystick," Amazon.com, downloaded Oct. 18, 2005, <http://www.amazon.com/gp/product/B00000JDFT/104-4029117-3811163?v=glance&n=172282&v=gla. . .>; 7 pages.
"Precision Sales, " Google images, downloaded Oct. 10, 2005, Google Image Result for http://www.precisionsales.com/PageMill_Images/Image9.gif>; 1 page.
"ADNS-2051 High-Performance Optical Mouse Sensor," Agilent Technologies, downloaded Oct. 10, 2005, <http://www.home.agilent.com/USeng/nav/-536893734,536883737/pd.html>; 2 pages.
"Agilent ADNS-2051 Optical Mouse Sensor," Agilent Technologies Inc., Product Overview, 2003; 2 pages.
"Agilent ADNS-2030 Optical MouseSensor," Agilent Technologies Inc., Data Sheet, 2004; 4 0pages.
"ADNS-2030 High Performance, Low Power Optical Mouse Sensor (Optimized for Cordless Mouse Applications)," Agilent Technologies, downloaded Oct. 10, 2005, <http://www.home.agilent.com/USeng/nav/-536893734,536883737/pd.html>; 2 pages.
"Agilent ADNS-2051 Optical Mouse Sensor," Agilent Technologies Inc., Product Overview, 2002; 4 pages.
"Agilent ADNS-2030 Low Power Optical Mouse Sensors" Agilent Technologies Inc., Data Sheet, 2005, 34 pages.
"Optical Mice and How they Work: The Optical Mouse is a Complete Imagining System in a Tiny Package," Agilent Technologies Inc., White Paper, Agilent Technologies Semiconductor Products Group, 2004; 4 pages.

Teo Chiang Mei "Understanding Optical Mice" Aligent Technologies Inc., White Paper, 2005; 10 pages.
"Agilent ADNK-2030 Solid-State Optical Mouse Sensor" Agilent Technologies Inc., Sample Kit, 2003; 1 page.
"Agilent Optical Mouse Sensors," Agilent Technologies Inc., Selection Guide, 2004; 3 pages.
Cypress Perform, Design Resources, Dec. 31, 2005 web archive, PSoC Mixed-Signal Array Application Notes, Patches, Code, and PSoC Designer V. 4.2, dated between Oct. 10, 2003 to Dec. 6, 2004; 1 page.
EDACafe.com, "Cypress Delivers Low-Cost Development Kits for PSoC Mixed Signal Array Devices," Feb. 10, 2005; 3 pages.
PSoC Designer, example.dynamic_pwm [CY8C27443], PSoC Designer Screen Shot.jpg, Sep. 3, 2009; 1 page.
Cypress, PSoC "Solutions Erochure," the Programmable System-on-Chip, Cypress Perform, 2006, pp. 1-5; 5 pages.
Cypress PSoC Mixed Signal Array for Automotive Applications, Cypress Semiconductor Corporation, Nov. 2, 2004, pp. 1-4, 4 pages.
Cypress Mixed Signal Array PSoC - Jan. 2004, "Cypress Unveils PSoC Designer 4.0 IDE for PSoC Mixed Signal Array," Cypress Semiconductor Corporation, Jan. 14, 2004, pp. 1-3; 3 pages.
Cypress MicroSystems PSoC Seminars, EmbeddedStar.com, Cypress MicroSystems, Oct. 04, 2002 pp. 1-3, Mar. 30, 2003 pp. 1: Jul. 19, 2003 pp. 1; 4 pages.
Dennis Seguine, "Capacitive Switch Scan," Cypress Semiconductor Application Note, Apr. 14, 2005, 6 pages.
Mark Lee "CapSense Best. Practices," Cypress Semiconductor Application Note, Oct. 16, 2006; 10 pages.
International Search Report of the International Searching Authority for International Application No. PCT/US2005/041952 (SLMP0359) mailed Nov. 30, 2006; 4 pages.
Amm et al., "Grating Light Valve Technology: Update and Novel Applications," Silicon Light Machines, Presented at Society for Information Display Symposium, Anaheim, CA, May 19, 1998; 4 pages.
Amm et al., "Optical Performance of the Grating Light Valve Technology," Silicon Light Machines, Presented at Photonics West-Electronic Imaging, 1999, 8 pages.
R.W. Corrigan, "An Alternative Architecture for Higher Performance Display," Silicon Light Machines, Presented at SMPTE Technical Conference and Exhibition, New York, NY, Nov. 20, 1999; 5 pages.
Corrigan et al., "Calibration of a Scanned Linear Grating Light Valve Protection System," Silicon Light Machines, Presented at Society for information Display Symposium, San Jose, CA, May 18, 1999, 4 pages.
Corrigan et al.,"Silicioni, Light Machines - Grating Light Valve Technology Brief," Sunnyvale, CA, Jun. 2001, version C; 8 pages.
D.M. Bloom, "The Grating Light Valve: Revolutionizing Display Technology," Silicon Light Machines, Sunnyvale, CA, 1997; 10 pages.
USPTO Notice of Allowance for U.S. Appl. No. 11/123,326 (SLMP0338) dated Jul. 9, 2007; 4 pages.
USPTO Non-Final Rejection, for U.S. Appl. No. 11/123,326 (SLMP0338) dated Mar. 21, 2007; 6 pages.
USPTO Miscellaneous Action for U.S. Appl. No. 11/123,326 (SLMP0338) dated Jun. 8, 2005; 1 page.
R. E. Kalman, "A New Approach to Linear Filtering and Prediction Problems," Transactions of the ASME-Journal of Basic Engineering, Copyright 1960, Research Institute for Advanced Study; Baltimore, MD; 12 pages.
USPTO Notice of Allowance for U.S. Appl. No. 11/261,316 (SLMP0352) dated Aug. 23, 2006; 6 pages.
USPTO Non-Final Refection. For U.S. Appl. No. 11/261,316 (SLMP0352) dated Jun. 6, 2006; 6 pages.
USPTO Notice of Allowance for .U.S. Appl. No. 11/128,988 (SLMP0345) dated Feb. 2, 2008; 7 pages.
USPTO Notice of Allowance for U.S. Appl. No. 11/268,898 (SLMP0356) dated Apr. 19, 2007; 9 pages.
Cypress Semiconductor Corporation, "Cypress Introduces PSoC(TM)-Based Capacitive Touch Sensor Solution," Cypress Press Release: May 31, 2005, <http://www.cypress.com/portal/server>; retrieved on Feb. 5, 2007: 4 pages.

Seguine, Ryan; "Layout Guidelines for PSoC CapSense," Cypress Semiconductor Corporation, Application Note AN2292: Jul. 22, 2005: 13 pages.

Lee, Mark, "EMC Design Considerations for PSoC CapSense Applications," Cypress Semiconductor Corporation, Application Note AN2318, Sep. 16, 2005; 6 pages.

Cypress Semiconductor Corporation, "Release Notes srn017," Jan. 24, 2007; 3 pages.

Cypress Semiconductor Corporation, "PSoC CY8C20x34 Technical Reference Manual (TRM )" PSoC CY8C20x34 TRM, Version 1.0, 2006; 220 pages.

Sedra et al., "Microelectronic Circuits," 3rd Edition, 1991 Oxford University Press, Feb. 5, 2007; 20 pages.

Van Ess, David; "Simulating a 555 Time with PSoC," Cypress Semiconductor Corporation, Application Note AN2286, May 19, 2005; 10 pages.

Cypress Semiconductor Corporation, "FAN Controller CG6457AM and CG6462AM," PSoC Mixed Signal Array Preliminary Data Sheet; May 24, 2005; 25 pages.

Cypress Semiconductor Corporation "PSoC Mixed-Signal Controllers," Production Description;<http://www.cypress.com/portal/server>: retrieved on Sep. 27, 2005; 2 pages.

Cypress Semiconductor Corporation, "CY8C21x34 Data Sheet," CSR User Module, CSR V.1.0; Oct. 6, 2005; 36 pages.

Chapwesk Adam; "The PS/2 Mouse Interface," PS/2 Mouse Interfacing, 2001, retrieved on May 18, 2006; 11 pages.

* cited by examiner

METHOD AND APPARATUS FOR SENSING THE FORCE WITH WHICH A BUTTON IS PRESSED

TECHNICAL FIELD

The present invention relates generally to electronic circuits and in particular to circuits for sensing force.

BACKGROUND

Force-sensing buttons have found recent widespread use in human interface devices such as gamepads for the entertainment consoles like the Sony PlayStation™ and Microsoft Xbox™. A conventional gamepad 100 is shown in FIG. 1. The conventional gamepad 100 comprises a housing 110, having four force-sensing triggers 120, a D-pad 130 with four force sensing buttons controlled by a left hand, four force sensing buttons 140 controlled by a right hand, and two thumbsticks 150 controlled by thumbs. The force sensing buttons comprise electronic force sensing actuators (in which the force applied to a button is sensed, rather than the binary state of a button) to provide variable force inputs to the console. In this conventional gamepad, there are twelve force sensing buttons/actuators. Typically each force sensing button/actuator output is translated in a six or eight bit value representing the force applied.

One conventional implementation for a force sensing actuator is the use of a force sensing resistor, such as those sold by Interlink Electronics (cited in information disclosure statement). However the force sensing resistor solution is too expensive for many applications where cost is an important factor. Many purchasers of gamepads and other consumer products are very price sensitive, so having a low manufacturing cost is important.

Another lower cost conventional implementation (which has been adopted by many gamepad manufacturers) is to use a resistive track printed on a printed circuit board (PCB). Printed circuit boards typically comprise a substrate, with one or more layers of copper traces on the surface or sandwiched between layers of substrate. To prevent corrosion and to prevent short circuits, the copper traces are coated with a thin film of "solder resist" except at the locations of pads or holes where components are to be soldered to the copper traces. In some cases, the copper traces may be gold plated.

In some cases, PCBs also contain resistive carbon traces printed on one or both sides of the PCB. The resistivity of such traces may vary between a few ohms/square and several kilo ohms/square. Such carbon traces may be used for a variety of purposes, including preventing corrosion of exposed copper contacts and to implement a variable resistance in combination with an external actuator or wiper.

The cost of a PCB is determined primarily by its area, the type of substrate material used, the number and size of holes in the PCB, and the number of layers of copper traces. The minimum width of the traces, and the minimum distance between traces also may significantly affect PCB cost, but the number of traces, or the percentage of the area of the PCB that is covered in copper are not significant factors affecting the cost of a PCB.

FIG. 2 shows a conventional actuator button 200 such as one used in a gamepad or other control device. The button has a carbon-impregnated domed rubber actuator, which makes contact with a resistive carbon PCB track. As the button is pressed harder, the rubber dome deforms, progressively shorting out more of the printed carbon PCB track, reducing the end-to-end resistance of the track, as shown in FIG. 2.

When the button is in the 'rest' position 210, it is not in contact with a carbon track 250, and resistive value of the track is shown as the resistor representation 260. When the button is gently pressed it goes to position 220, where the tip of the dome contacts the carbon track 250, and shorts across a small portion of the track 250. This is visible as the 'shorted out' portion of the resistor representation 265. When the button is pressed more firmly as shown in position 230, the tip of the dome deforms to become flatter and shorts out a larger portion of the track 250. This is visible as the wider 'shorted out' portion of the resistor representation 270. Finally, if the button is pressed hard as shown in position 240, the tip of the dome deforms to become quite flat and shorts out a much wider portion of the track 250, such that almost the entire track 250 is shorted out. This is visible as the widest 'shorted out' portion of the resistor representation 275.

The arrows in the drawing show the portion of the track which is not shorted out, and which is therefore resistive. The area between the arrows shows the area of the track which is shorted out. It can therefore be seen that as the rubber button is pressed harder, more of the track is shorted out, and the total resistance between the 2 ends of the track is reduced. The resistive track usually has a total resistance of a few kilo ohms, while the resistance of the conductive coating on the bottom of the rubber button is typically a few ohms at most. The resistance may be measured by placing a second resistor (for example 10K Ohms) in series with it to form a potentiometer, and measuring the output voltage from the potentiometer using an analog to digital converter (ADC).

This conventional actuator button and resistive track of FIG. 2 is somewhat less accurate than the force sensing resistor (FSR) approach, and has lower linearity. The main reason for the lower accuracy and non-linearity of the conventional actuator button and resistive track is the difficulty in printing a resistive track with a consistent resistivity along its length, and consistent resistivity from printed track to printed track. It is difficult to accurately control the thickness of the printed trace in a mass manufacturing process. However, absolute accuracy and linearity may not be important in many applications, and with calibration it is possible to give reasonably consistent results. Firmware may be used to calibrate for the non-linearity and also to calibrate for the changes in resistance as the rubber dome wears out with use. However, while the conventional actuator button and resistive track solution is less expensive than a force sensing resistor, it still costs several cents for each printed resistive trace on the PCB, and such costs can be significant in a consumer product with many force-sensing buttons (for example twelve buttons in the example of FIG. 1).

FIG. 3 shows a disassembled conventional gamepad 300, with resistive carbon traces 310, and conductive rubber dome actuators 320.

FIG. 4 shows a printed circuit board layout 400 of the conventional gamepad. The layout 400 shows resistive carbon printed traces 410, PCB traces 420, and solder resist (in this case blue, generally green in color) 430.

It would be desirable to have a less expensive force sensing button. A preferred force sensing button would be "free" (apart from the cost of the actuator itself) and provide linear sensing of force, with absolute accuracy that was consistent after calibration (low drift).

DETAILED DESCRIPTION

Described is a solution for a force sensing actuation that uses the electrical properties of a printed circuit board, together with a conductive-tip actuator as to make a force-sensing button at extremely low cost.

Figure 1:
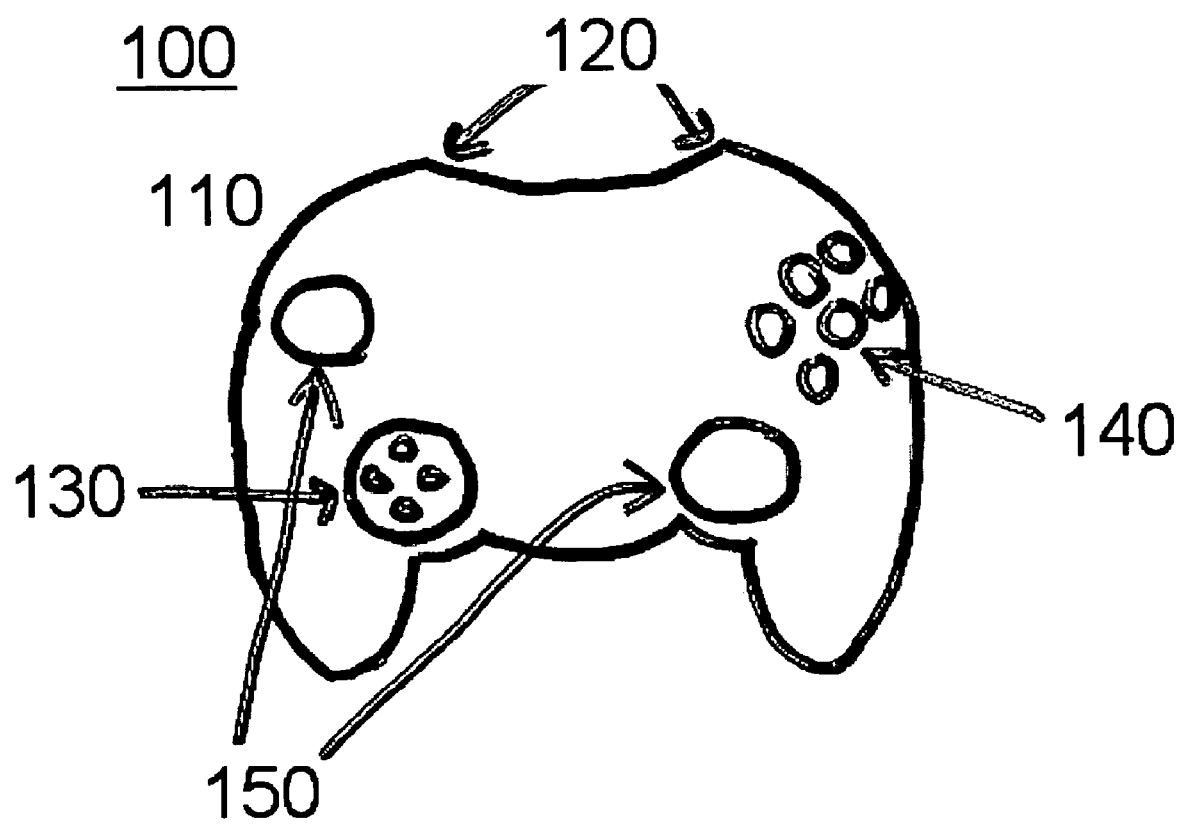
FIG. 1 illustrates a conventional gamepad device.
Figure 2:
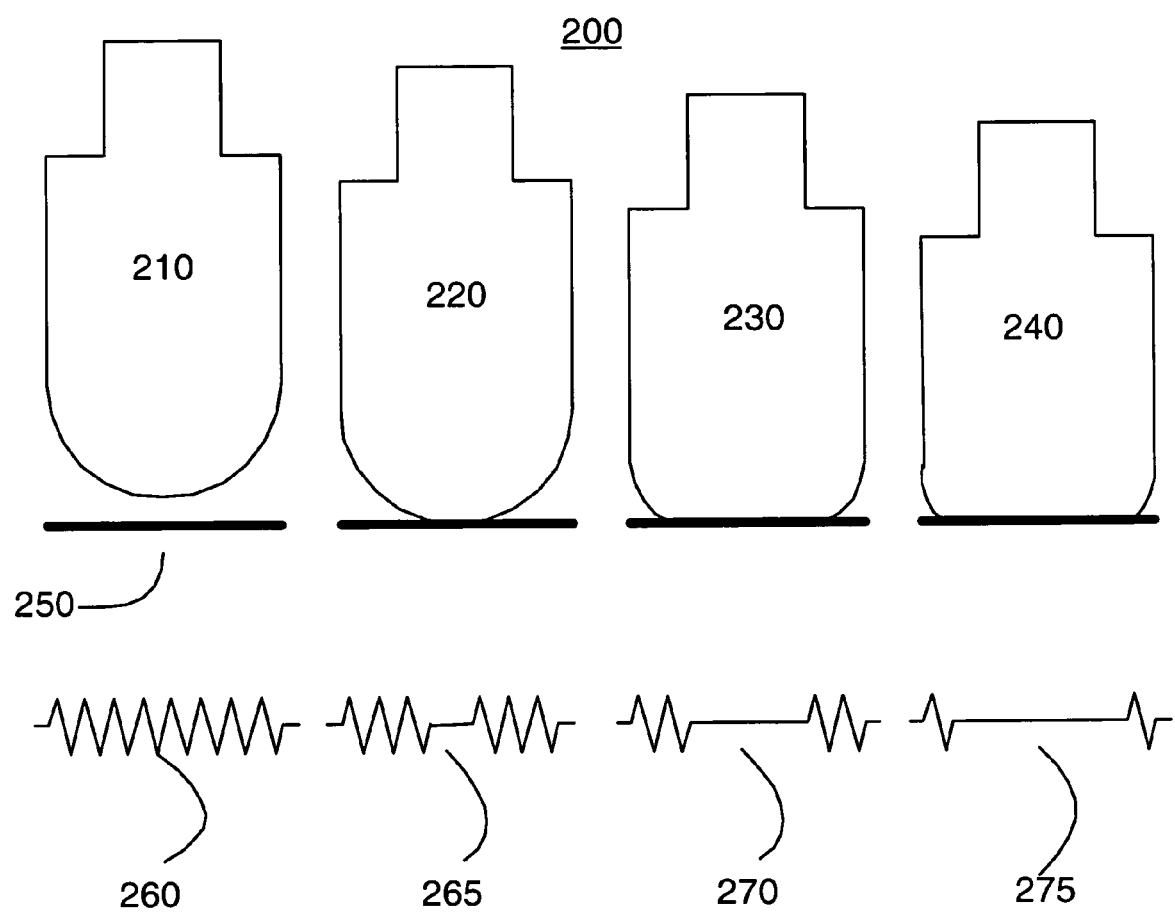
FIG. 2 illustrates a conventional actuator button.
Figure 3:
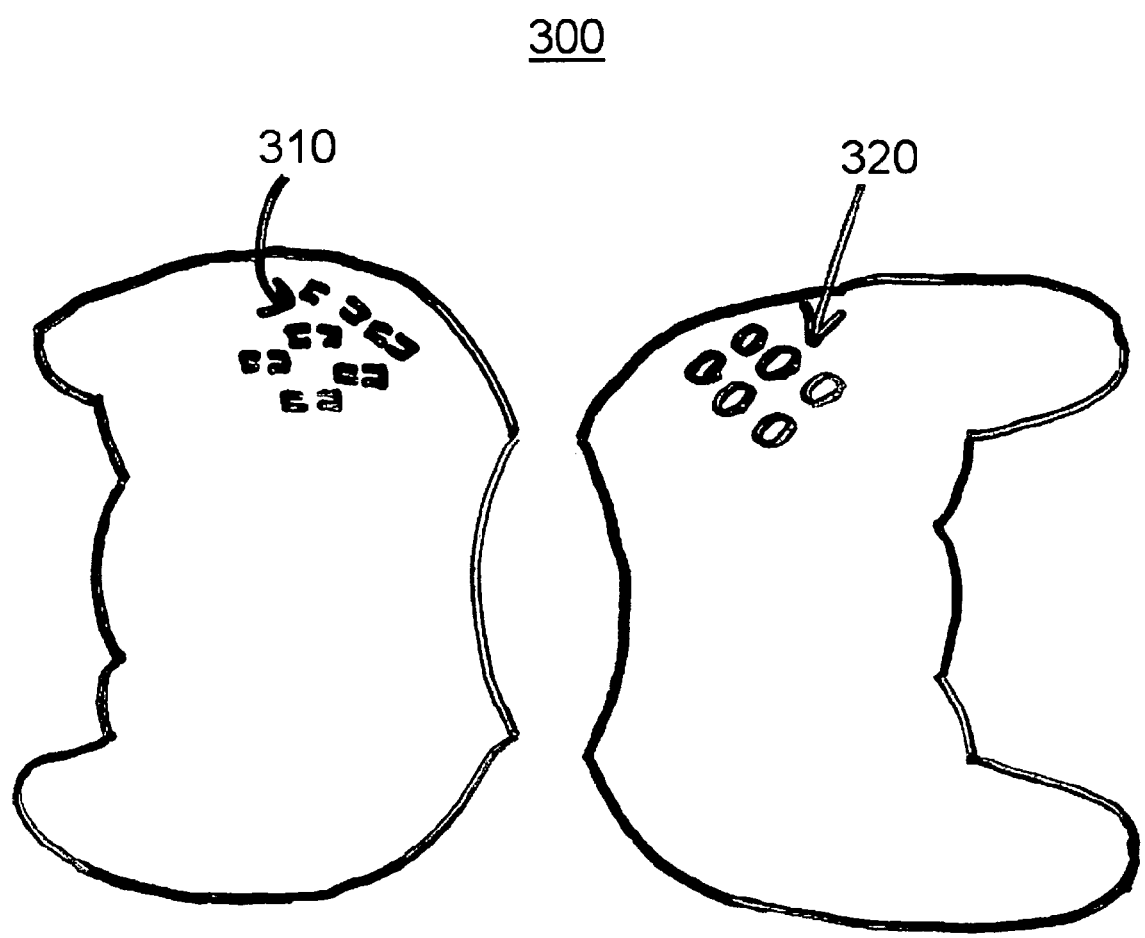
FIG. 3 illustrates a disassembled conventional gamepad.
Figure 4:
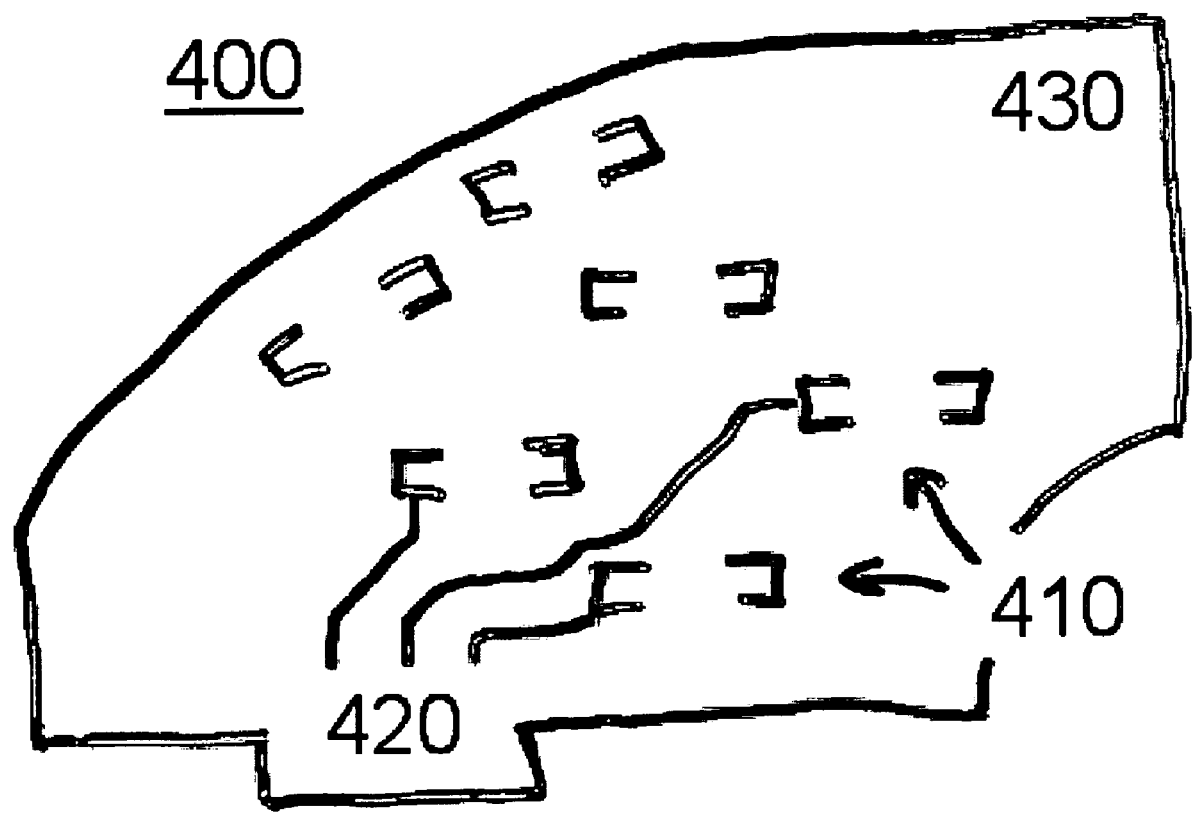
FIG. 4 illustrates a printed circuit board layout of the conventional gamepad layout.
Figure 5:
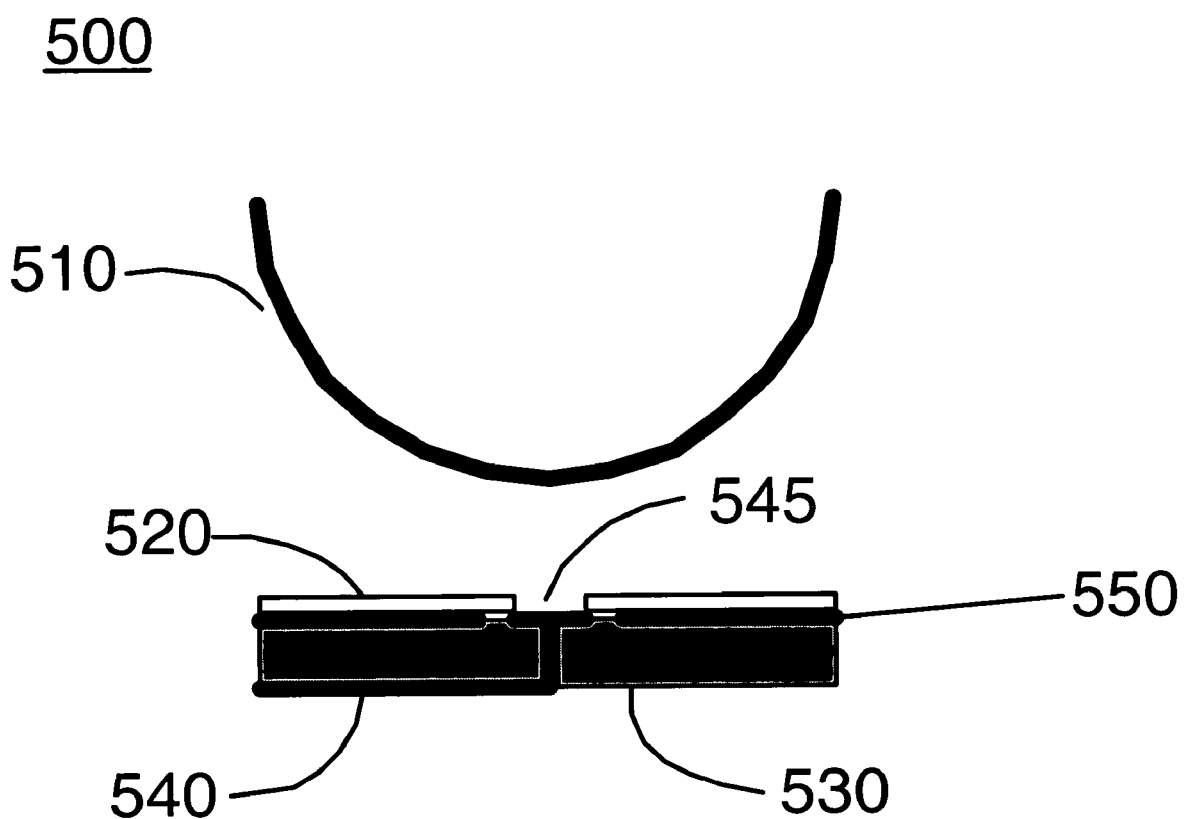
FIG. 5 illustrates a side view of an improved force sensing actuator.

FIG. 5 shows a side view 500 of the improved solution. The improved solution comprises a rubber actuator dome 510 which has a conductive layer (in one embodiment carbon) on the surface. In another embodiment, the entire actuator dome could be formed of conductive flexible material, or be impregnated with conductive material. The rubber actuator dome 510 is positioned above a PCB substrate 530. A conductive layer 550 is formed on the PCB substrate 530, and an insulating solder resist layer 520 is formed over the conductive layer 550. In one embodiment, the conductive layer 550 is a PCB trace comprising copper or an alloy thereof. A trace 540 is formed on a lower layer or on the opposite side of the PCB from the conductive layer 550 and the solder resist 520. The trace 540 is electrically isolated (i.e. not shorted to) from the conductive layer 550, the trace 540 forms a contact 545 on the PCB on the same side as the solder resist 520. The contact 545 is not fully covered by solder resist 520, such that any conducting material pressed down onto the top surface of the substrate will make electrical contact with contact 545. In another embodiment the contact 545 is exposed (i.e. there is no solder resist over it).

Figure 6:
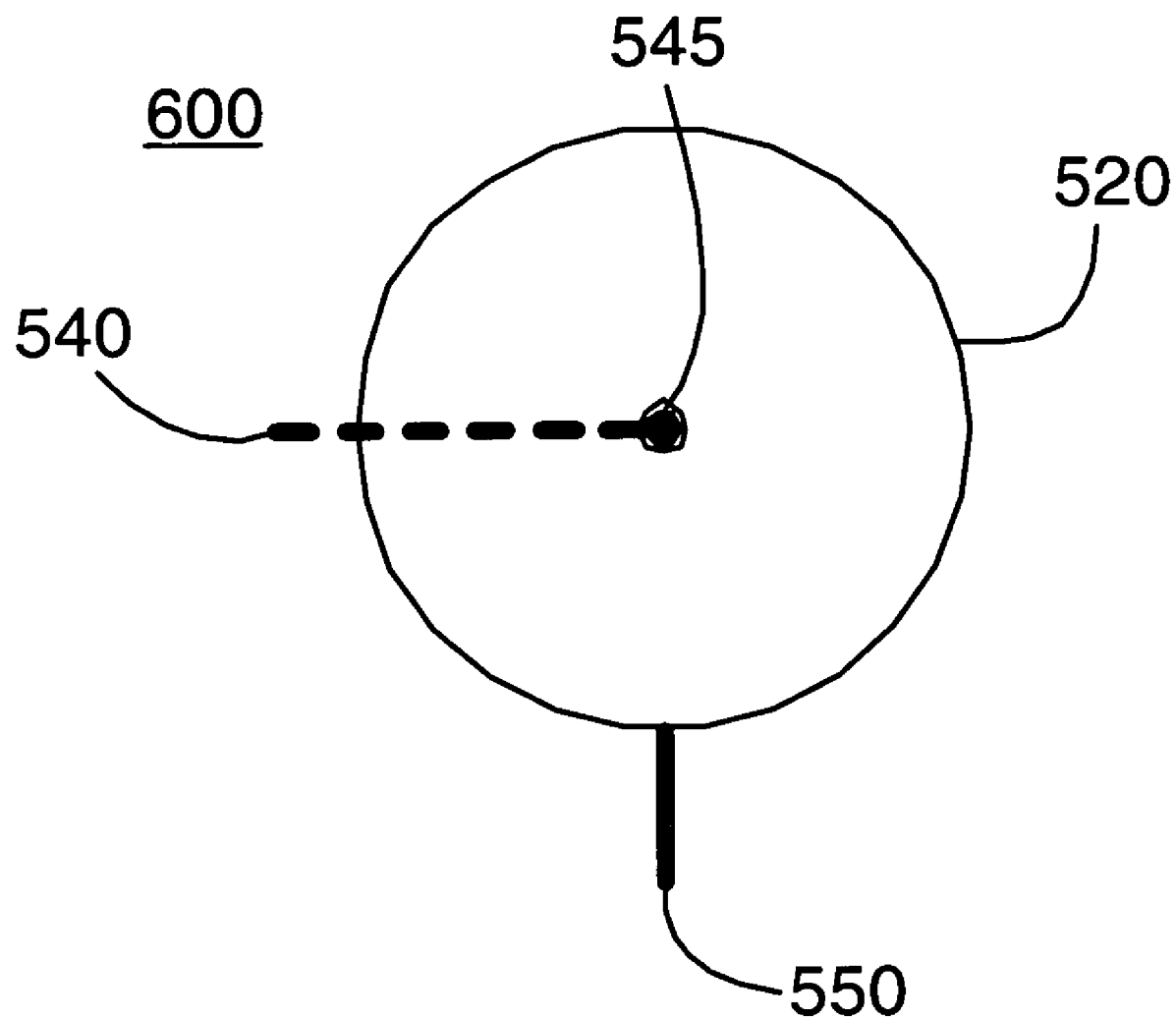
FIG. 6 illustrates a plan view of an improved force sensing actuator

FIG. 6 shows a plan view 600 of the arrangement of FIG. 5. Plan view 600 shows the PCB trace 550 (in one embodiment in a circular shape, but could have any shape). Located between the edges of the PCB trace is the contact 545. In one embodiment this may be located approximately in the center of the PCB trace 550. Trace 540 is shown as a dotted line, this trace will be electrically connected to the rubber actuator dome 510 (which is not shown in the plan view) when the dome is pressed into contact with the substrate. Trace 560 is the trace from the lower electrode which is coupled to conductive PCB trace 550.

The actuator 510 is formed of, impregnated with or coated with a conductive material with a low resistivity, for example carbon. The rubber actuator dome may be the same type as used in conventional solutions. Solder resist is commonly used to coat the copper traces of a PCB to protect it from short circuits and oxidation and is of relatively uniform thickness and reasonably constant relative permitivity, with a value of approximately 4 in one example.

The value of the capacitance between two parallel plates is calculated as the permitivity of the material between the plates (the dielectric) multiplied by the overlapping area of the two plates, divided by the distance between the plates. Permitivity is commonly specified as two parts the permitivity of free space (epsilon-0 or $E_0$) and the relative permitivity of a particular material (gas, liquid, solid) known as epsilon-r or $E_r$. Thus, the permitivity (epsilon) is $E_0 * E_r$.

A capacitor may be formed by the combination of a copper trace 550 (which acts as a lower plate), the solder resist 520 (which acts as a dielectric) and the conductive (e.g. carbon-printed) rubber actuator dome (which acts as an upper plate). As the actuator 510 is pressed down onto the PCB it will make contact with trace 540 through contact 545; as the actuator is pressed down with greater force, it will deform and a greater area of the conductive button will come into close proximity with the lower plate 550, thus increasing the capacitance between plate 550 and trace 540. A circuit on the board can be used to measure this capacitance. The output to be measured is a frequency that varies with capacitance. One example of such a circuit used to measure capacitance is a relaxation oscillator; this and other circuits for accurately measuring or detecting small changes in capacitance will be familiar to one skilled in the art. A processing element may read the output of this circuit and thus infer the force with which the button is being pressed.

The shape of the conductive trace 550 or the solder resist 520 can be varied while preserving the function of the invention. In order to maximize the capacitance between the actuator 510 and the trace 550, the trace 550 should generally cover the full area of contact of the actuator with the substrate when pressed with maximum force. In various configurations, the shape could be circle, square, rectangle, triangle, or any combination of these or other shapes. The shape could have 1, 2, 3, 4, 5, 6, 7, 8, 9, 10 or more sides, depending on how PCB layout software implements the conductive trace. PCB design/layout software may approximate a circular shape with a many sided shape, as true curves may be difficult to implement in PCB layout software. The conductive trace 550 may completely surround the contact 545, or may partially surround (such as a horseshoe shape) the contact 545. The conductive trace 550 may also be formed as a plurality of pieces (such as a pie chart shape) surrounding or partially surrounding the contact 545. The contact 545 may be located somewhere inside the limits of trace 520; generally the contact 545 should be located at or close to the point on the substrate where the actuator first touches the PCB, i.e. where the actuator touches when pressed with least force.

The improved solution operates in the following manner. In a first step when the actuator 510 is first touched by a user, it touches the sensor contact 545 which connects the actuator dome 510 to trace 540. In one example, trace 540 may be connected to electrical ground, such that dome 510 becomes grounded when it touches contact 545. This creates a small capacitance between the trace 550 and a ground voltage coupled to trace 540 and contact 545. In a second step when the actuator is pressed more firmly it deforms and approaches a wider surface of the trace 550 causing the capacitance between trace 550 and electrical ground to increase. In a third step, a circuit measures the capacitance. In a fourth step a microcontroller samples the circuit output and determines the capacitance value. In a fifth step, a digital representation of that capacitance value is generated. In one embodiment, this digital representation may be a six bit or eight bit value.

Figure 7:
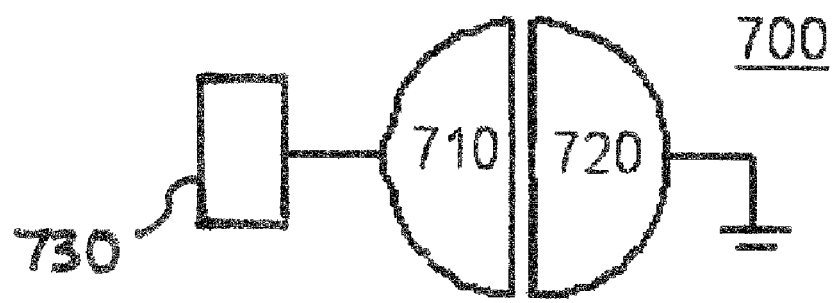
FIG. 7 illustrates an alternative embodiment of the improved force sensing actuator.

FIG. 7 shows an alternative embodiment 700 of the improved solution. In the embodiment 700 a first trace 710 is formed in close proximity to a second trace 720. Second trace 720 is coupled to ground. The traces 710 and 720 are electrically isolated, i.e. they are not shorted out. A layer of solder resist may be used to cover traces 710 and 720. The actuator 510 in combination with the first trace 710 and second trace 720 and solder resist 520 form a three plate capacitor, with two plates 710 and 720 side by side and the actuator acting as the third plate. In this embodiment the actuator does not make DC contact with either plates, allowing easier mechanical alignment during manufacturing, but may reduce the possible capacitance between the plates. Trace 710 is coupled to the measurement device 730.

Figure 8:
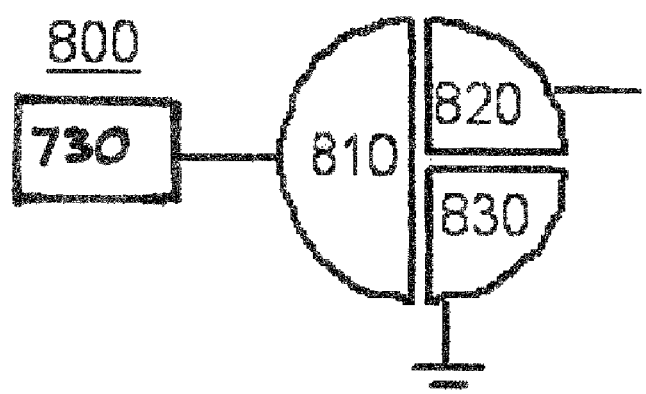
FIG. 8 illustrates another embodiment of the improved force sensing actuator.

FIG. 8 shows a further alternative embodiment 800 of the improved solution. In the embodiment 800, a first trace 810, a second trace 820 and a third trace 830 are formed. The first trace 810 is larger than either the second trace 820 or the third trace 830. The third trace 830 is coupled to ground. The second trace 820 is coupled to a logic input and the first trace 810 is coupled to the measurement device 730. A layer of solder resist is formed over plate 810, but plates 820 and 830 are not covered by solder resist.

The embodiment 800 operates in the following manner. When the actuator makes contact with the plates 820 and 830, the conductive actuator shorts them out and forms a DC connection to ground between the plates, which is detected by the logic input. Thus, the embodiment 800 forms both a combination switch and force sensing button.

Figure 9:
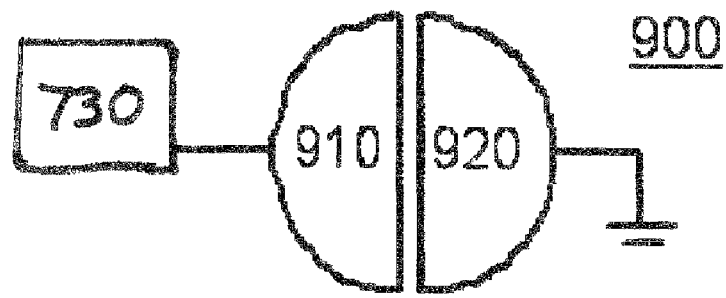
FIG. 9 illustrates another alternative embodiment of the improved force sensing actuator

In another alternative embodiment 900 shown in FIG. 9, plate 910 is fully covered with solder resist 520, and plate 920 is fully uncovered. When actuator 510 is pressed against the substrate, the actuator 510 is therefore grounded and, and a 2-plate capacitor is formed by 910 and 510 with solder resist acting as the dielectric.

Figure 10:
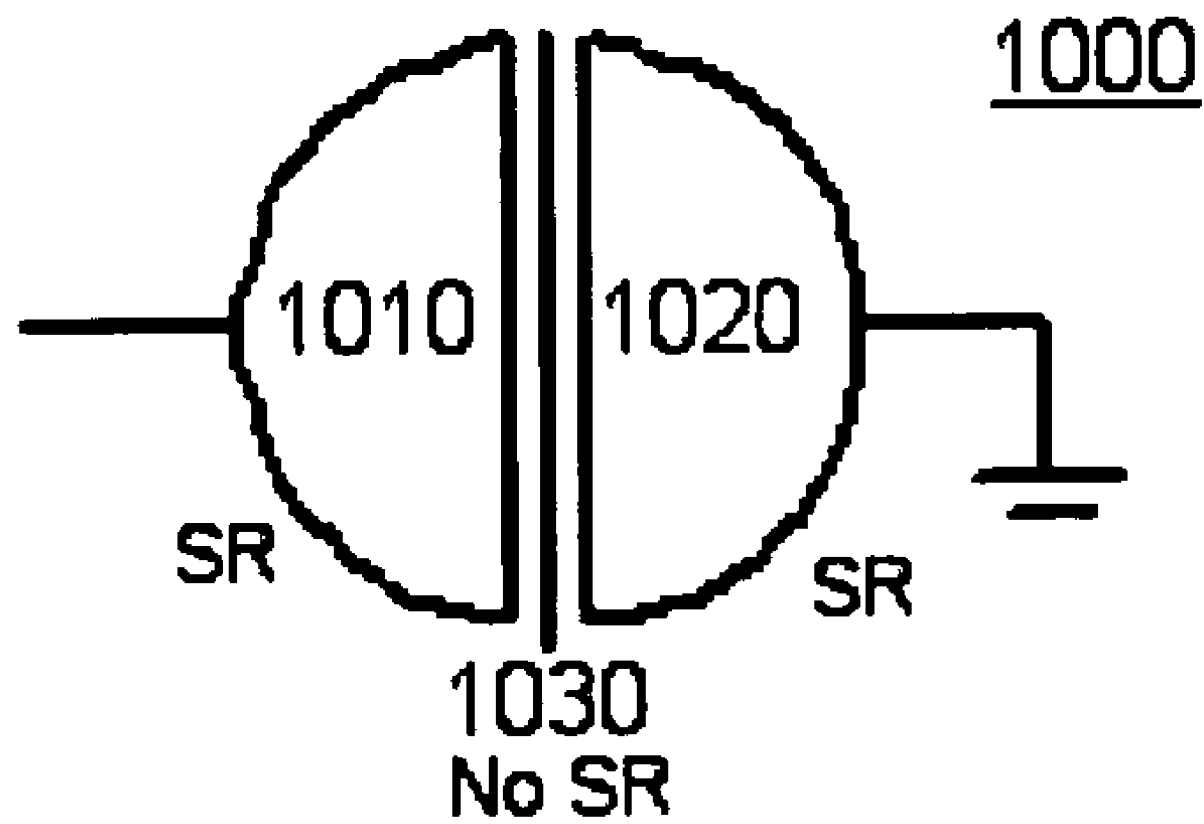
FIG. 10 illustrates another alternative embodiment of the improved force sensing actuator

Another alternative embodiment 1000 is shown in FIG. 10. The embodiment 1000 comprises a first plate 1010, a second plate 1020, and a grounded trace 1030 placed between the first plate and the second plate. First plate 1010 and second plate 1020 are covered in solder resist, but trace 1030 is exposed (i.e. no solder resist). This embodiment 1000 is well suited for implementation on a single side PCB board. In another embodiment, a further trace 1040 is present and located between the first plate 1010 and second plate 1020, where trace 1030 is grounded and trace 1040 is a logic output.

Embodiments of the present invention are well suited to performing various other steps or variations of the steps recited herein, and in a sequence other than that depicted and/or described herein. In one embodiment, such a process is carried out by processors and other electrical and electronic components, e.g., executing computer readable and computer executable instructions comprising code contained in a computer usable medium.

For purposes of clarity, many of the details of the improved force sensing actuator and the methods of designing and manufacturing the same that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A combination force-sensing button and switch, comprising:
    a first conductive plate having a first shape,
        wherein the first conductive plate is coupled to a capacitance measuring circuit,
        wherein an insulating layer is formed on a surface of the first conductive plate,
        wherein the capacitance measuring circuit is configured to measure a first capacitance value in response to a press on the surface by an actuator having a conductive deformable surface, and
        wherein a force of actuation is generated in accordance with the measured first capacitance value;
    a second conductive plate having a second shape,
        wherein the second conductive plate is coupled to a detection circuit; and
    a third conductive plate having a third shape,
        wherein the third conductive plate is coupled to a reference voltage,
        wherein the first, second, and third conductive plates are electrically isolated from each other and arranged in proximity to one another, and
        wherein the detection circuit is configured to detect an electrical connection between the second and third conductive plates to indicate a switch activation when the second and third conductive plates are pressed by the actuator,
    wherein the first shape is a substantially semicircular shape, and wherein the second and third shapes each are a substantially quadrant shape.

2. The combination of claim 1, wherein the first, second, and third conductive plates are mounted on a substrate.

3. The combination of claim 1, wherein the reference voltage comprises a ground.

4. The combination of claim 1, wherein the arrangement of the first, second, and third shapes of the first, second, and third conductive plates, respectively, forms a substantially geometric shape.

5. The combination of claim 4, wherein the geometric shape comprises a circle.

6. The combination of claim 1, wherein an area of the first conductive plate is larger than areas of either the second or third conductive plates.

7. The combination of claim 1, wherein the insulating layer comprises solder resist.

8. The combination of claim 1, wherein the detection circuit is configured to determine whether the actuator is in contact with the second and third conductive plates, and
    wherein the capacitance measuring circuit is configured to measure capacitance when the actuator is detected as being in contact with the second and third conductive plates.

9. A combination force-sensing button and switch, comprising:
    a first conductive plate having a first shape,
        wherein the first conductive plate is coupled to a capacitance measuring circuit, wherein an insulating layer is formed on a surface of the first conductive plate,
wherein the capacitance measuring circuit is configured to measure a first capacitance value in response to a press on the surface by an actuator having a conductive deformable surface, and
wherein a force of actuation is generated in accordance with the measured first capacitance value;
a second conductive plate having a second shape,
wherein the second conductive plate is coupled to detection circuit; and
a third conductive plate having a third shape,
wherein the third conductive plate is coupled to a reference voltage,
wherein the first, second, and third conductive plates are electrically isolated from each other and arranged in proximity to one another, and
wherein the detection circuit is configured to detect an electrical connection between the second and third conductive plates to indicate a switch activation when the second and third conductive plates are pressed by the actuator,
wherein the arrangement of the first, second, and third shapes of the first, second, and third conductive plates, respectively, forms a substantially geometric shape, wherein the geometric shape comprises a circle,
wherein the first shape is a substantially semicircular shape, and
wherein the second and third shapes each are a substantially quadrant shape.

10. A method of combining button force-sensing and switch activation, comprising:
forming an insulating layer on a surface of a first conductive plate having a first shape,
arranging the first conductive plate, a second conductive plate having a second shape, and a third conductive plate having a third shape in proximity to each other such that the arrangement of the first, second, and third shapes forms a substantially geometric shape,
wherein no insulating layer is formed on the second and third conductive plates,
wherein the first, second, and third conductive plates are electrically isolated from each other, and
wherein the third conductive plate is coupled to a reference voltage;
measuring a first capacitance value in response to a press on the surface of the first conductive plate by an actuator having a conductive deformable surface;
determining a force of actuation in accordance with the measured first capacitance value;
and
detecting an electrical connection between the second and third conductive plates to indicate a switch activation when the second and third conductive plates are pressed by the actuator, wherein the first shape is a substantially semicircular shape, and wherein the second and third shapes each are a substantially quadrant shape.

11. The method of claim 10, wherein the reference voltage comprises a ground.

12. The method of claim 10, wherein the geometric shape comprises a circle.

13. The method of claim 10, wherein an area of the first conductive plate is larger than areas of either the second or third conductive plates.

14. The method of claim 10, wherein the insulating layer comprises solder resist.

15. The method of claim 10, wherein the step of determining comprises:
computing the force of actuation from a magnitude of the measured first capacitance value.

16. The method of claim 10, comprising:
determining whether the actuator is in contact with the second and third conductive plates, and
measuring the first capacitance value when the actuator is determined to be in contact with the second and third conductive plates.

* * * * *